United States Patent [19]

Saikaishi et al.

[11] 3,950,702

[45] Apr. 13, 1976

[54] CIRCUITS FOR DETECTING TRIGGER SIGNALS FOR USE IN SYNTHESIZING TYPE RECEIVERS

[75] Inventors: Noboru Saikaishi; Yukio Numata; Tsuneo Yamada, all of Tokyo, Japan

[73] Assignee: Trio Electronics Incorporated, Tokyo, Japan

[22] Filed: Sept. 16, 1974

[21] Appl. No.: 506,101

[30] Foreign Application Priority Data

Sept. 18, 1973  Japan ............................. 48-105201

[52] U.S. Cl. ............................. 325/335; 325/470
[51] Int. Cl.² ..................................... H04B 1/32
[58] Field of Search .......... 325/320, 332, 349, 455, 325/468, 469, 470, 335; 329/110, 126; 328/140; 307/233, 273, 295

[56] References Cited
UNITED STATES PATENTS 3,466,550  9/1969  Wolf et al. ...................... 325/320 X
3,482,166  12/1969  Gleason .............................. 325/468

Primary Examiner—Benedict V. Safourek
Attorney, Agent, or Firm—Charles E. Pfund

[57] ABSTRACT

A trigger signal for indicating the receiving point of a synthesizing type high frequency receiver including a voltage controlled oscillator is detected by a circuit comprising means for deriving an intermediate frequency signal from the received high frequency signal, a wave shaper for shaping the waveform of the intermediate frequency signal, a first monostable circuit connected to the output of the wave shaper and having a time constant larger than the width of the output but smaller than the minimum frequency spacing between individual stations, a second monostable circuit connected to the output of the first monostable circuit and having a time constant smaller than the width of the output of the wave shaper, and an AND gate circuit for producing a logical product of the output of the second monostable circuit and a sweeping clock signal.

6 Claims, 4 Drawing Figures

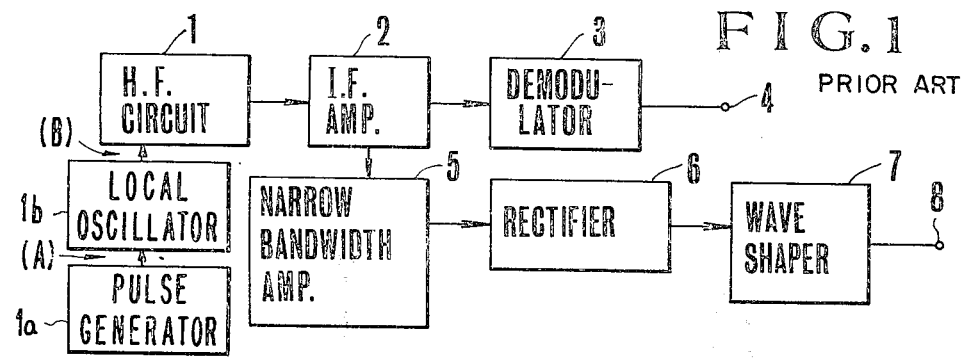
FIG.1 PRIOR ART
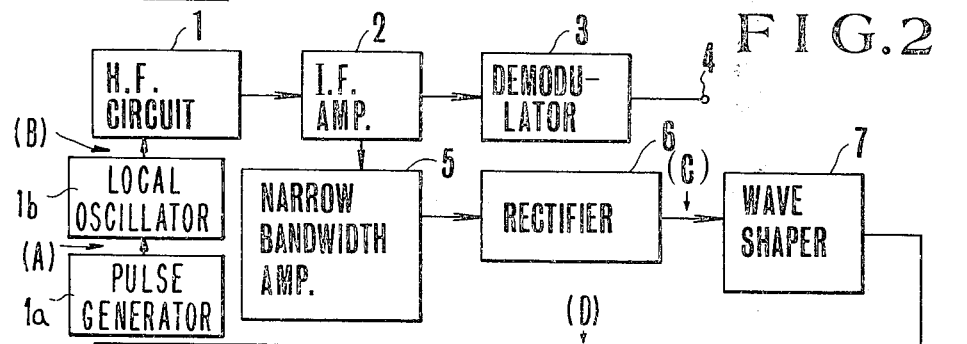
FIG.2
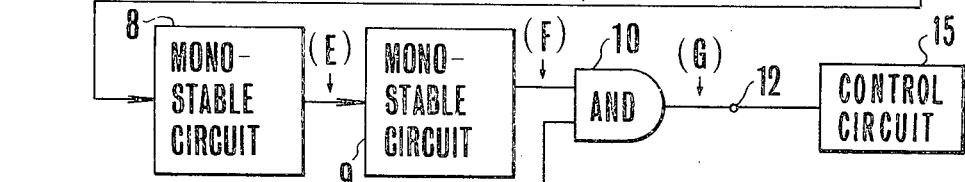
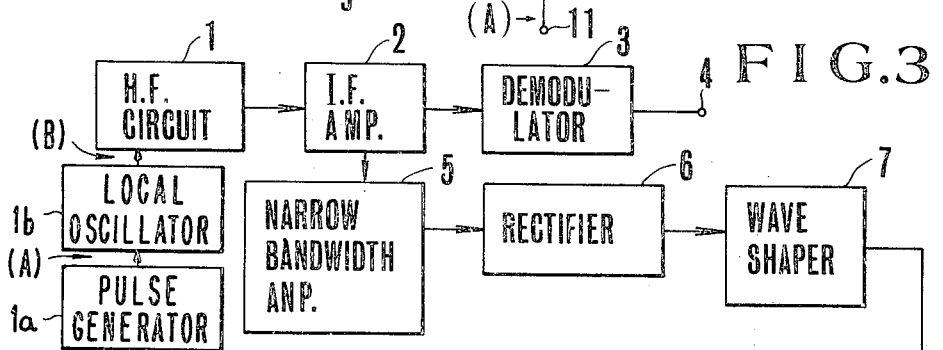
FIG.3
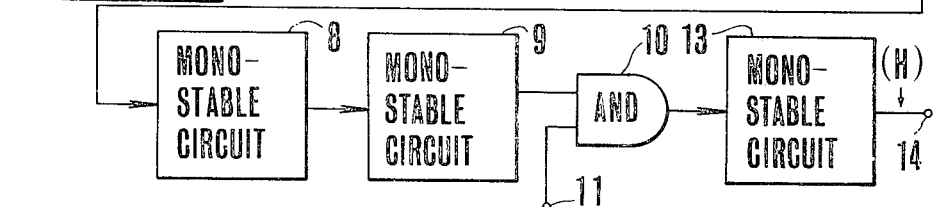

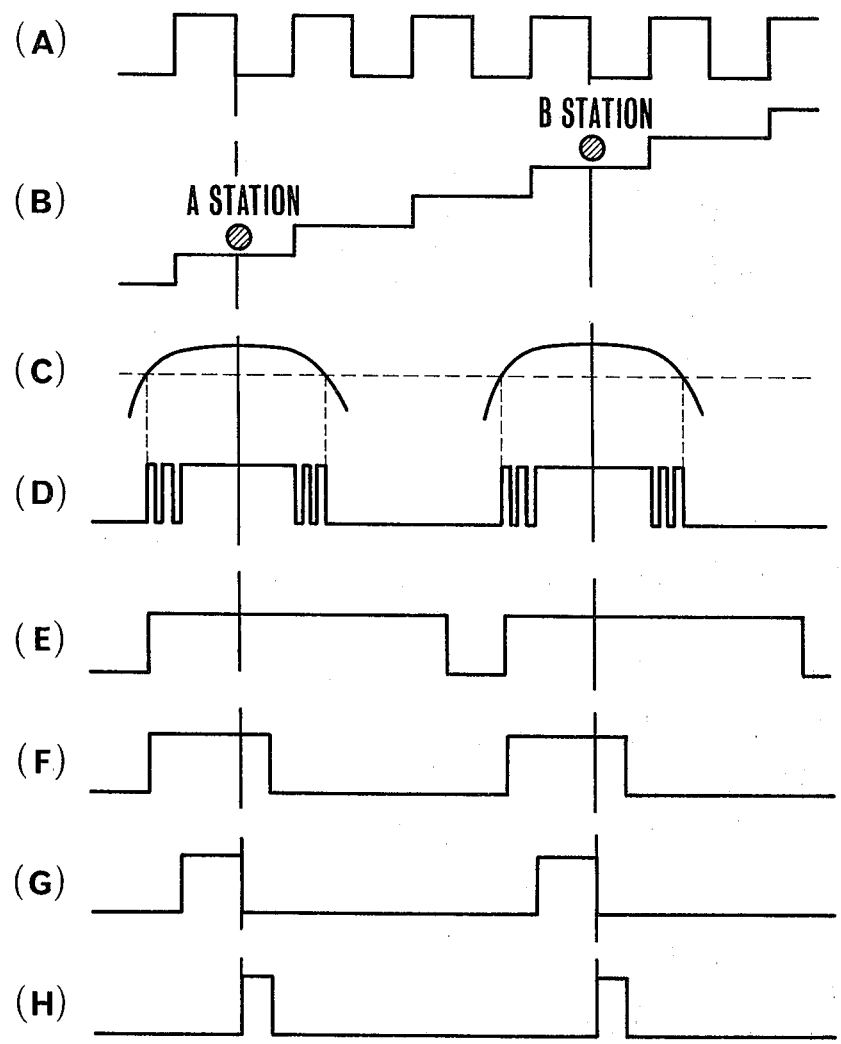

CIRCUITS FOR DETECTING TRIGGER SIGNALS FOR USE IN SYNTHESIZING TYPE RECEIVERS

BACKGROUND OF THE INVENTION

This invention relates to a circuit for detecting a trigger signal for correctly indicating the receiving point of a synthesizing type high frequency receiver.

Prior to the present invention, the trigger signal utilized as the sweep stop signal for an automatic tuning operation of a high frequency receiver, a trigger signal of a muting circuit or as a display signal for displaying a receiving point by means of a luminous diode or an incandescent lamp, has been generated by a circuit as shown in FIG. 1 which comprises a receiver including a high frequency circuit 1 including a pulse generator 1a for generating sweeping clock pulses, a local oscillator 1b comprised of a PLL (phase locked loop) circuit so controlled as to produce stepwise local oscillation signals by the clock pulses and a mixer, not shown, an intermediate frequency amplifier 2, a demodulator 3 for producing an audio frequency signal to the output terminal 4 connected to a utilization circuit such as a loudspeaker, not shown; and a circuit for deriving out the trigger signal including a narrow bandwidth amplifier 5 for amplifying an intermediate frequency signal taken out of the intermediate frequency amplifier 2, a rectifier 6 connected to rectify the output from the narrow bandwidth amplifier 5, a wave shaper 7 which consists, for example, of a Schmidt trigger circuit and an output terminal 8. Alternatively, the trigger signal is formed by an AND gate circuit with one input connected to receive a DC signal derived out from the demodulator and the other input connected to receive a DC signal supplied by said rectifier.

In such a prior art circuit, as the receiving point indicating circuit is caused to misoperate by the output of the rectifier or the voice current demodulated by the demodulator, it has been the usual practice to increase the time constant of the rectifier circuit or to include a time constant circuit having a large time constant in the later stage of the demodulator for the purpose of preventing leakage of the voice current, thus preventing the misoperation of the receiving point indicating circuit. However, in a synthesizing type receiver which utilizes, as its local oscillator, a voltage controlled oscillator whose oscillation frequency is successively varied by a sweeping clock pulse, and the oscillator is tuned by electronic sweeping, as the sweeping speed increases, the receiving frequency is swept transiently in an extremely short time. For this reason, it is difficult to detect DC signal due to the time constant of the circuit and hence to increase the sweep speed.

SUMMARY OF THE INVENTION

It is an object of this invention to provide an improved circuit for detecting a trigger signal utilized to display the receiving point without the difficulties described above.

Another object of this invention is to provide an improved circuit for detecting a trigger signal which is stable, not affected by the leakage of voice signals and can be used as various control signals for the synthesizing type high frequency receiver.

According to this invention, there is provided a circuit for detecting a trigger signal for use in a synthesizing type high frequency receiver which uses as its local oscillator a voltage controlled oscillator whose oscillation frequency is sequentially varied by means of a sweeping clock signal, said circuit comprising means for deriving an intermediate frequency signal from the received high frequency signal, a wave shaper for shaping the waveform of the intermediate frequency signal, into a pulse, a first monostable circuit connected to receive the output from the wave shaper, said first monostable circuit having a time constant larger than the width of the output pulse but smaller than the minimum frequency spacing between individual stations, a second monostable circuit connected to receive the output of the first monostable circuit and having a time constant smaller than the width of the output of the wave shaper, and an AND gate circuit for producing a logical product of the output of the second monostable circuit and the sweeping clock pulse, the AND gate circuit producing a signal which is used as the trigger signal.

Where a trigger signal having much smaller width is desired, a third monostable circuit having a time constant smaller than that of the second monostable circuit is connected to the output of the AND gate circuit.

BRIEF DESCRIPTION OF THE DRAWINGS

Further objects and advantages of the invention can be more fully understood from the following detailed description taken in conjunction with the accompanying drawings in which:

FIG. 1 shows a block diagram of a prior art circuit for detecting a trigger signal for indicating a receiving point;

FIGS. 2 and 3 are block diagrams of preferred embodiments of the novel circuit for detecting the trigger signal for indicating the receiving point of a synthesizing type high frequency receiver; and FIG. 4 shows waveforms at various portions of the circuit embodying the invention.

DESCRIPTION OF THE PREFERRED EMBODIMENTS

A preferred embodiment of the circuit for detecting a trigger signal for indicating a receiving point of a synthesizing type high frequency receiver shown in FIG. 2 comprises a high frequency circuit 1 including a local oscillator in the form of a voltage controlled oscillator whose oscillation frequency is successively varied by means of a sweeping clock pulse, and a mixer. The high frequency signal received by the high frequency circuit 1 is converted into an audio frequency signal appearing at the output terminal 4 through an intermediate frequency amplifier 2 and a demodulator 3 and the audio frequency signal is applied to a utilization device, a loudspeaker, not shown, for example. To receive the high frequency signal a step shaped DC voltage as shown in FIG. 4B which is produced by a sweeping clock pulse 4A from a pulse generator 1a as shown in FIG. 4 is impressed upon the voltage controlled oscillator 1b contained in the high frequency circuit 1. Suppose now that the signal from a station A is received. The intermediate frequency signal derived out of the intermediate frequency amplifier 2 is amplified by a narrow bandwidth amplifier 5 and then rectified by rectifier 6 to form a signal having a waveform as shown in FIG. 4C. Since the time constant of the rectifier 6 is small, due to the leakage of the voice current the output of the wave shaper 7 has a considerably irregular rectangular waveform as shown in FIG. 4D. According to this invention, a monostable circuit 8 is connected to be triggered by the first build-up portion of the irregular rectangular wave. If the time constant of the monostable circuit is selected to be sufficiently large a pulse output having a large width as shown in FIG. 4E will be produced, the pulse width being determined by the minimum frequency spacing between individual stations that can be actually received. More particularly, where sweeping is made from station A to station B it is possible to produce an output pulse having a width just before detection of the intermediate frequency of station B. In the illustrated example the frequency spacing between individual stations A and B is 300 kHz. Accordingly, the width of the output pulse (time constant) of the monostable circuit 8 is set to be larger than the width of the output (shown in FIG. 4D) of the wave shaper 7 but smaller than the minimum frequency spacing between individual stations. A more advantageous result can be obtained when a delay effect is provided for the monostable circuit 8.

As described above, although the output of the wave shaper 7 is an irregular square wave as shown in FIG. 4D, it is possible to obtain an output pulse free from any irregularity as shown in FIG. 4E by passing the irregular square wave through the monostable circuit 8.

For the purpose of converting the output pulse from the first monostable circuit 8 into a pulse having a desired width there is provided a second monostable circuit 9. Thus, the width (or the time constant) of the output pulse of the second monostable circuit 9 is smaller than the width of the output from the wave shaper 7 and is generally selected to be larger than twice of the width of the sweeping clock pulse but to be smaller than three times of the width of the sweeping clock pulse. FIG. 4F shows the output waveform of the second monostable circuit 9. The output pulse from the second monostable circuit 9 whose pulse width has been shaped to the desired value is applied to one input of an AND gate circuit 10. The sweeping clock pulse 4A is applied to the other input of the AND gate circuit 10 thus producing a logical product. The AND gate circuit 10 produces an output pulse as shown by FIG. 4G at the output terminal 12. This output pulse is used as the trigger signal for indicating the receiving point. A control circuit 15 connected to the output terminal 12 operates to indicate the receiving point of the receiver, to generate a sweeping stop signal for an automatic tuning circuit of the receiver, or to disable a muting circuit of the receiving circuit.

In the modified embodiment of this invention shown in FIG. 3, the output pulse from the AND gate circuit 10 is applied to a third monostable circuit 13 having a sufficiently small time constant for producing an output pulse at the output terminal 14 having sufficiently small pulse width. Such output pulse is useful for applications which require trigger signals having small width, for example, for the "search operation" in which the sweeping speed of the luminous diode or incandescent lamp for indicating the receiving point is increased thereby lighting the diode or lamp for only the office which is broadcasting the signal. It will be clear that such trigger pulse of small width can be used to control muting or stopping the sweeping.

As has been described hereinabove, the invention provides a novel circuit for detecting the trigger signal for indicating the receiving point of a synthesizing type receiver which can produce a stable trigger signal not influenced by the leakage of the voice signal and having a high sweeping speed and stability even in the synchronous condition. The trigger signal detected by the detection circuit of this invention can also be used as various control signals for high frequency receiving, such as muting and sweep stopping.

What is claimed is:

1. A circuit for detecting a trigger signal for use in a synthesizing type high frequency receiver which uses as its local oscillator a voltage controlled oscillator whose oscillation frequency is sequentially varied by means of a sweeping clock pulse, said circuit comprising means for deriving an intermediate frequency signal from the received high frequency signal, means including a rectifier for said intermediate frequency signal and a wave shaper responsive to the initial rise of the output signal of said rectifier for shaping the waveform of said intermediate frequency signal into a pulse, a first monostable circuit connected to respond to the output from said wave shaper, said first monostable circuit having a time constant larger than the width of said output pulse of said wave shaper but smaller than the time to scan the minimum frequency separation between individual stations, a second monostable circuit connected to respond to the output of said first monostable circuit and having a time constant smaller than the width of the output of said wave shaper, and an AND gate circuit for producing a logical product of the output of said second monostable circuit and said sweeping clock pulse, said AND gate circuit producing a signal which is used as said trigger signal.

2. The circuit according to claim 1 which further comprises a third monostable circuit connected to receive the output from said AND gate circuit and having a time constant smaller than that of said second monostable circuit, and the output of said third monostable circuit is used as said trigger signal.

3. The circuit according to claim 1 and including utilization means responsive to trigger signal for producing a control signal which can be utilized for indicating the receiving point of said receiver, or as the sweeping stop signal of an automatic tuning circuit of said receiver or for the muting circuit of said receiving circuit.

4. The circuit according to claim 2 and including utilization means responsive to said trigger signal for producing a control signal which can be utilized for indicating the receiving point of said receiver, or as the sweeping stop signal of an automatic tuning circuit of said receiver or for the muting circuit of said receiving circuit.

5. The circuit according to claim 1 in which said means including a rectifier and a wave shaper further comprises a narrow bandwidth amplifier for amplifying said intermediate frequency signal and a rectifier for rectifying the output of said narrow bandwidth amplifier, and wherein said wave shaper is connected to the output of said rectifier.

6. The circuit according to claim 1 wherein, in the sweeping operation of said receiver, means for stepwise modulation of said local oscillator produces said intermediate frequency signal modulated by pulsating direct current, said wave shaper operative to transform said pulsating direct current into a rectangular wave having the same frequency as said pulsating direct current, said first monostable circuit operative to convert said rectangular wave into a first pulse having the same frequency as said rectangular wave but having a larger pulse width, and said second monostable circuit operative to convert said first pulse into a second pulse having the same frequency as said first pulse but having a smaller pulse width than said first pulse.

* * * * *